(12) United States Patent
Allen et al.

(10) Patent No.: US 7,468,330 B2
(45) Date of Patent: Dec. 23, 2008

(54) IMPRINT PROCESS USING POLYHEDRAL OLIGOMERIC SILSESQUIOXANE BASED IMPRINT MATERIALS

(75) Inventors: Robert David Allen, San Jose, CA (US); Richard Anthony DiPietro, Campbell, CA (US); Geraud Jean-Michel Dubois, Los Gatos, CA (US); Mark Whitney Hart, San Jose, CA (US); Robert Dennis Miller, San Jose, CA (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 268 days.

(21) Appl. No.: 11/398,135

(22) Filed: Apr. 5, 2006

(65) Prior Publication Data

US 2007/0238317 A1   Oct. 11, 2007

(51) Int. Cl.
*H01L 21/469* (2006.01)
(52) U.S. Cl. .................. 438/780; 438/781; 216/45
(58) Field of Classification Search ................ 438/780; 216/45
See application file for complete search history.

(56) References Cited

U.S. PATENT DOCUMENTS

| | | | |
|---|---|---|---|
| 5,484,867 A * | 1/1996 | Lichtenhan et al. ............ 528/9 |
| 5,861,235 A | 1/1999 | Harkness et al. |
| 5,949,130 A | 9/1999 | Fukuyama et al. |
| 6,576,345 B1 | 6/2003 | VanCleemput et al. |
| 6,730,617 B2 | 5/2004 | Carter |
| 6,873,026 B1 | 3/2005 | Brunemeier et al. |
| 2002/0192980 A1 | 12/2002 | Hogle et al. |
| 2004/0137241 A1 | 7/2004 | Lin et al. |
| 2005/0031964 A1 | 2/2005 | Babich et al. |
| 2005/0202350 A1 | 9/2005 | Colburn et al. |

FOREIGN PATENT DOCUMENTS

WO    WO 2005/031855 A1    4/2005

* cited by examiner

*Primary Examiner*—Jack Chen
*Assistant Examiner*—Sonya D McCall Shepard
(74) *Attorney, Agent, or Firm*—Schmeiser, Olsen & Watts

(57) ABSTRACT

A method of forming a structure. The method including: forming a layer of a polymerizable composition including one or more polyhedral silsesquioxane oligomers each having one or more polymerizable groups, one or more polymerizable diluents, one or more photoacid generators and/or one or more photoinitiators; pressing a surface of a template having a relief pattern into the layer, the template, the layer filling voids in the relief pattern; polymerizing the layer to have thick and thin regions corresponding to the relief pattern; removing the template; removing the thin regions of the dielectric layer; and either curing the layer to create a porous dielectric layer followed by filling spaces between the thick regions of the porous dielectric layer with an electrically conductive material or filling spaces between the thick regions of the dielectric layer with an electrically conductive material followed by curing the dielectric layer to create a porous dielectric layer.

1 Claim, 6 Drawing Sheets

IMPRINT PROCESS USING POLYHEDRAL OLIGOMERIC SILSESQUIOXANE BASED IMPRINT MATERIALS

FIELD OF THE INVENTION

This invention relates to processes for imprint lithography and more particularly for a material and process for use in imprint lithography.

BACKGROUND OF THE INVENTION

Semiconductor devices require many layers of wiring to interconnect devices such as field effect and bipolar transistors into integrated circuits. Two major factors limit the speed of advanced semiconductors. The first is the wiring density, which is a function of wire dimensions, and the second is capacitance, which is a function of the dielectric constant of the material in which the wires are embedded. Therefore, there is an ongoing need for semiconductor interconnection structures and processes that are dense and have low capacitance.

SUMMARY OF THE INVENTION

A method of forming a structure, comprising: forming on a substrate a precursor dielectric layer of a polymerizable composition comprising one or more polyhedral silsesquioxane oligomers each having one or more polymerizable groups, one or more polymerizable diluents, and (i) one or more photoacid generators, (ii) one or more photoinitiators, or (iii) a mixture of one or more photoacid generators and the one or more photoinitiators; pressing a surface of a template into the precursor dielectric layer, the template having a relief pattern on the surface, the precursor dielectric layer filling voids in the relief pattern; polymerizing the precursor dielectric layer and converting the precursor dielectric layer to a dielectric layer having thick and thin regions corresponding to the relief pattern; removing the template; removing the thin regions of the dielectric layer; either (i) curing the dielectric layer to create a porous dielectric layer followed by filling spaces between the thick regions of the porous dielectric layer with an electrically conductive material or (ii) filling spaces between the thick regions of the dielectric layer with an electrically conductive material followed by curing the dielectric layer to create a porous dielectric layer; wherein the polymerizing the precursor dielectric layer includes exposing the precursor dielectric layer to ultra-violet radiation; wherein the curing is performed at a temperature above about 300° C.; wherein the porous dielectric layer has a dielectric constant less than 3.9; wherein the polymerizable material has a viscosity of less than 50 centipoise at about 20° C.; and wherein the filling spaces between the thick regions of the dielectric layer includes either (a) depositing a conformal layer of copper over the dielectric layer, followed by electroplating a plated layer of copper on top of the conformal layer of copper, followed by removing portions of the conformal and plated layers of copper so top surfaces of the conformal and plated layers of copper are coplanar with a top surface of the dielectric layer, or (b) depositing a conformal layer of copper over the porous dielectric layer, followed by electroplating a plated layer of copper on top of the conformal layer of copper, followed by removing portions of the conformal and plated layers of copper so top surfaces of the conformal and plated layers of copper are coplanar with a top surface of the dielectric layer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIG. 2A a top view illustrating the section through which FIG. 1F is taken;

DETAILED DESCRIPTION OF THE INVENTION

Though not limited to any single use, the present invention may be advantageously used to fabricate damascene and dual-damascene wires and vias.

The present invention combines imprint lithography with materials that can be converted to low dielectric constants (where k, the dielectric constant, is less than about 3.9) in order to fabricate damascene and dual-damascene interconnect structures for integrated circuits. Imprint lithography is used with a photosensitive pre-dielectric material that is molded between a template having a relief pattern and a substrate, exposed to actinic radiation and the resulting patterned dielectric layer, having a three dimensional pattern, is used as part of a damascene or dual damascene process.

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric, and a CMP process is performed to make the surface of the conductor in the trench co-planar with the surface of the dielectric layer to form dual-damascene wires and dual-damascene wires having integral dual-damascene vias.

The present invention will be described in an exemplary dual damascene process, for forming wires with integral wires and vias, however it should be understood the method described is applicable to single damascene processes for forming wires or vias.

Figure 1A:
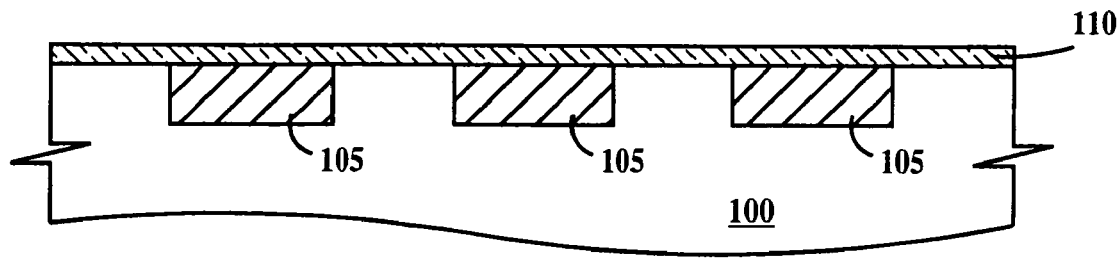
FIGS. 1A through 1F are cross sectional views showing a method of fabricating a dual damascene wire common to both a first and a second embodiment of the present invention.

FIGS. 1A through 1F are cross sectional views showing a method of fabricating a dual damascene wire common to both a first and a second embodiment of the present invention. In FIG. 1A, formed in a substrate 100 are electrically conductive wires (or contact studs) 105. A top surface of wires 105 is coplanar with a top surface of substrate 100. Formed on the top surfaces of wires 105 and substrate 100 is an optional copper diffusion barrier 110. In one example, copper diffusion barrier 110 is silicon nitride.

Figure 1B:
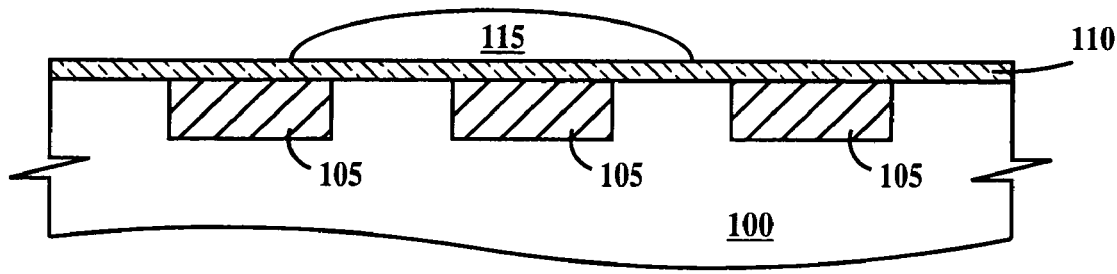

In FIG. 1B, a dielectric precursor material 115 is applied to the top surface of barrier 110. Precursor dielectric material 115 is a liquid. Dielectric precursor material 115 includes one or more substituted polyhedral silsesquioxane (PSS) oligomers, a photoinitiator and/or a photo-acid generator. The substituent groups of the PSS are directly photo-polymerizable or polymerizable in the presence of a photoinitiator or photoacid generator. Dielectric precursor material 115 advantageously has a low viscosity.

Figure 1C:
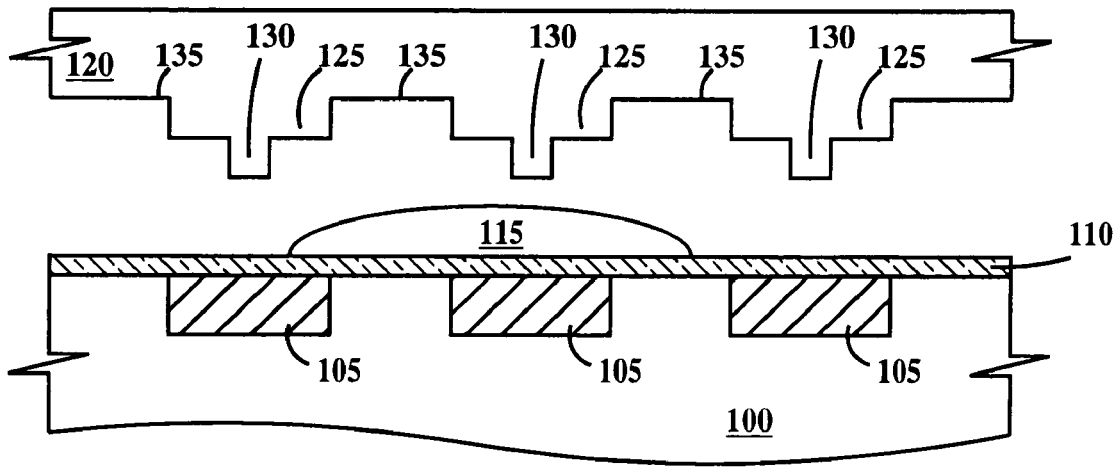
Figure 1D:
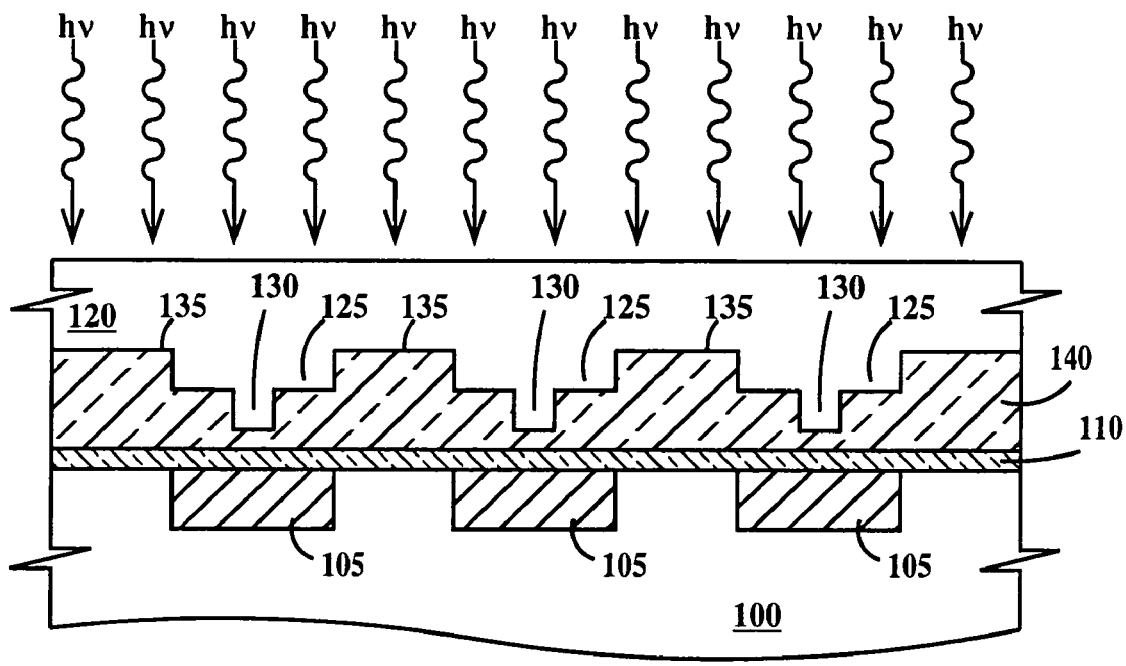

As illustrated in FIGS. 1C and 1D and described infra, when an imprint template is pressed against a substrate with imprint material on its surface, the imprint material fills the recesses in the template and also forms a so-called residual layer between the bottom-most surface of the template and the top-most surface of the substrate. A low viscosity imprint material reduces the force and the time required to fill the template recesses and achieve an acceptably thin residual layer. Reducing the imprint force reduces mechanical distortions of the imprint template and allows for better alignment/overlay capabilities, while reducing the time to fill the template recesses and achieve an acceptably thin residual layer increases the throughput of the imprint process.

Because substituted PSS oligomers have high viscosities it is advantageous to add low viscosity diluents to the dielectric precursor material. In one example, the substituted PSS oligomers of the embodiments of the present invention have viscosities of about 1000 centipoise or higher at about 20° C. However, for the imprinted structure (see FIG. 1F) to duplicate and maintain the fine features and sharp edges of the imprint mask it is advantageous that the low viscosity diluents also be polymerizable. Therefore, dielectric precursor material 115 may further include one or more low viscosity polymerizable diluents.

In one example, one or all of the polymerizable diluents are polymerizable monomers. In one example, the viscosity of one or all of the polymerizable diluents is less than about 30 centipoise at about 20° C. In one example, dielectric precursor material 115 includes about 50% by weight of polymerizable diluents. In one example, dielectric precursor material 115 includes about 50% by weight of polymerizable diluents having a viscosity of about 30 centipoise or less at about 20° C. In one example, dielectric precursor material 115 includes enough polymerizable diluents to reduce the viscosity of the precursor dielectric material to about 50 centipoise or less at about 20° C.

In a first example, precursor dielectric material 115 has a viscosity of less than about 100 centipoise when measured at about 20° C. In a second example, precursor dielectric material 115 is a liquid which has a viscosity less than about 50 centipoise when measured at about 20° C. In a third example, precursor dielectric material 115 is a liquid which has a viscosity between about 20 centipoise and about 50 centipoise when measured at about 20° C. In a fourth example, precursor dielectric material 115 is a liquid which has a viscosity of about 20 centipoise or less when measured at about 20° C.

The composition of precursor dielectric material 115 is described in detail infra.

In FIG. 1C, an imprint template 120 includes a relief pattern made up of plateaus 125 and 130 rising above a reference surface 135. Plateaus 130 rise above plateaus 125. Imprint template 120 is pressed with a low pressure (i.e., less than about 1 psi) toward substrate 100, and the pool of dielectric precursor material 115 (see FIG. 1C) is spread out over copper diffusion barrier 110, completely filling the spaces between plateaus 125 and 130 and reference surface 135 and a top surface of copper diffusion barrier 110.

In FIG. 1D, after exposure to actinic radiation (in one example ultraviolet (UV) light), the dielectric precursor material 115 (see FIG. 1C) is converted (i.e. the PSS oligomers and polymerizable monomer are cross-linked) to a dielectric material 140.

Figure 1E:
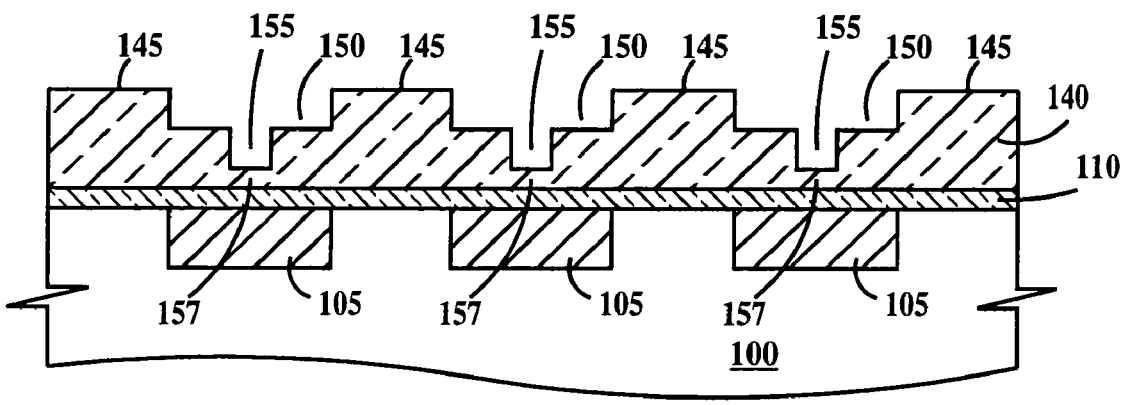

In FIG. 1E, template 120 is removed exposing a top surface 145 of dielectric layer 140 and trenches 150 having integral pre-via openings 155 formed in the dielectric layer. Pre-via openings 155 are open to top surface 145 of dielectric layer 140. A residual layer 157 of dielectric material 115 (see FIG. 1B) remains in the bottom of pre-via openings 155.

Figure 1F:
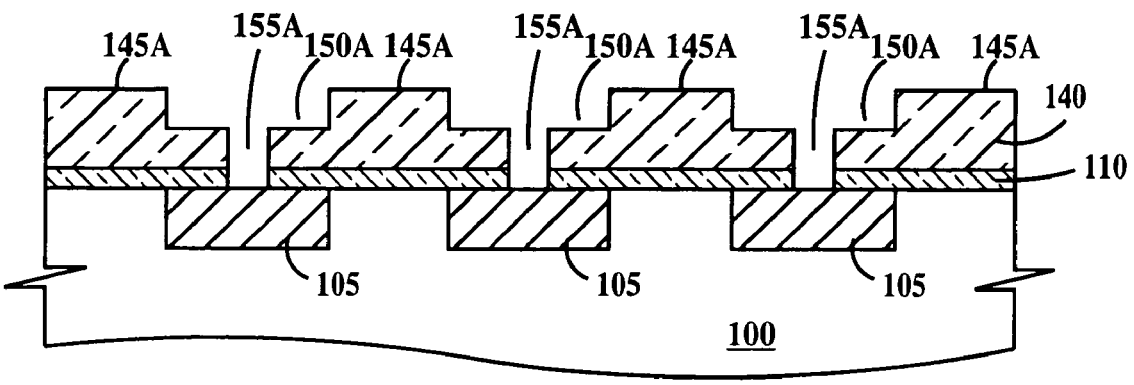

In FIG. 1F, a blanket etch is performed to remove any of residual layer 157 from the bottoms of via openings 155 (see FIG. 1E) and an additional etch is performed to remove copper diffusion barrier 110 at the bottom of the vias opening and expose wires 105. The blanket etch removes a portion of top surface 145 (see FIG. 1E) and creates a new top surface 145A of dielectric layer 140. Trench 150 (see FIG. 1D) is deepened to create trenches 150A and vias 155A are created. In one example, the blanket etch and the additional etch are reactive ion etches (RIEs). Alternatively, a single RIE etch may be performed to etch both dielectric layer 140 and copper diffusion barrier 110.

Figure 2A:
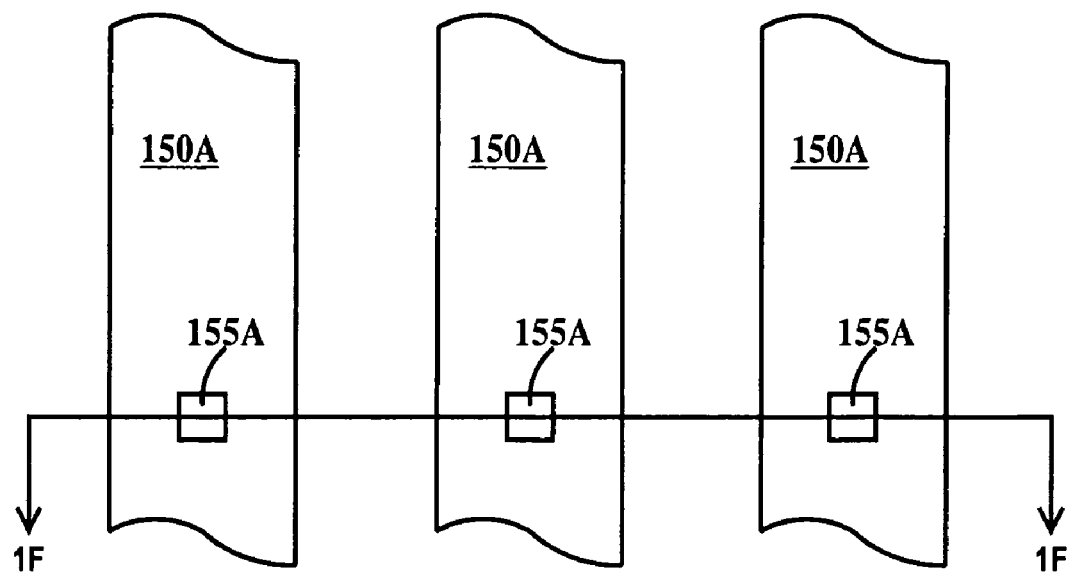

FIG. 2A a top view illustrating the section through which FIG. 1F is taken. In FIG. 2A, trenches 150A extend laterally and via openings 155A are contained within the perimeter of trenches 150A. Alternatively, the two opposite sides of via openings 155A facing the sidewalls of the trench may extend to those sidewalls.

Figure 2B:
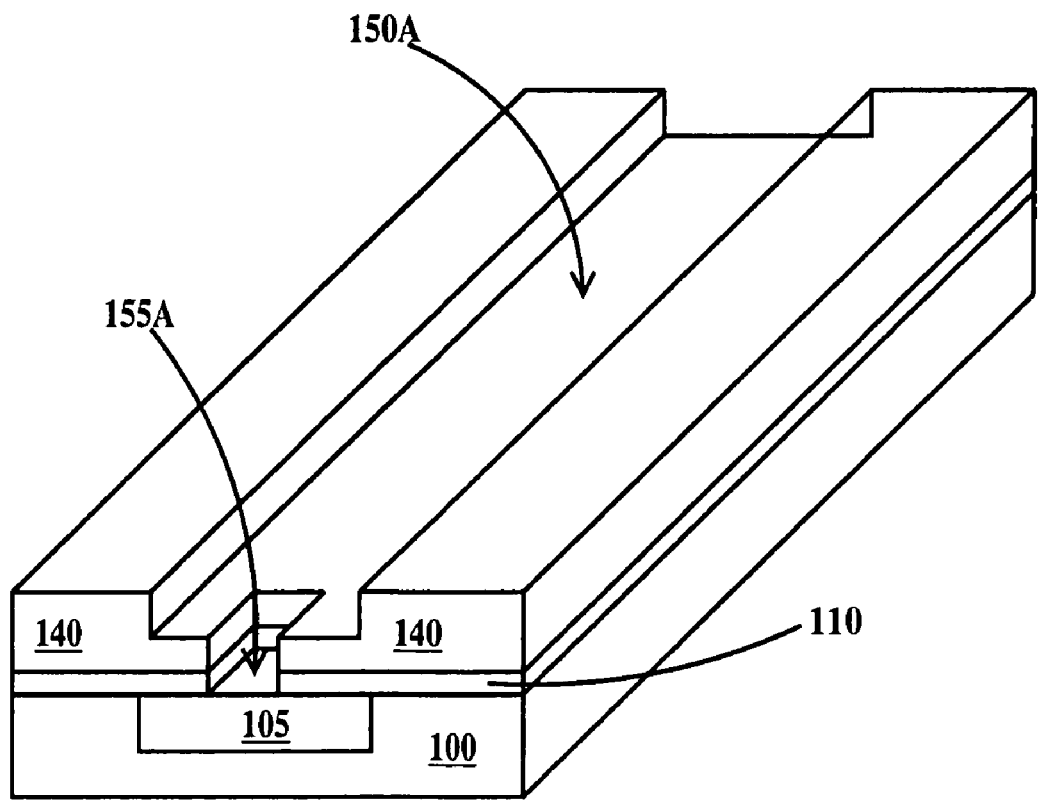
FIG. 2B is an isometric drawing of a trench and via opening as illustrated in FIG. 1F.

FIG. 2B is an isometric drawing of a trench and via opening as illustrated in FIG. 1F. In FIG. 2B, via opening 155A is shown in cutaway and it is clear that trench 150A is not as deep as via opening 155A.

Figure 3A:
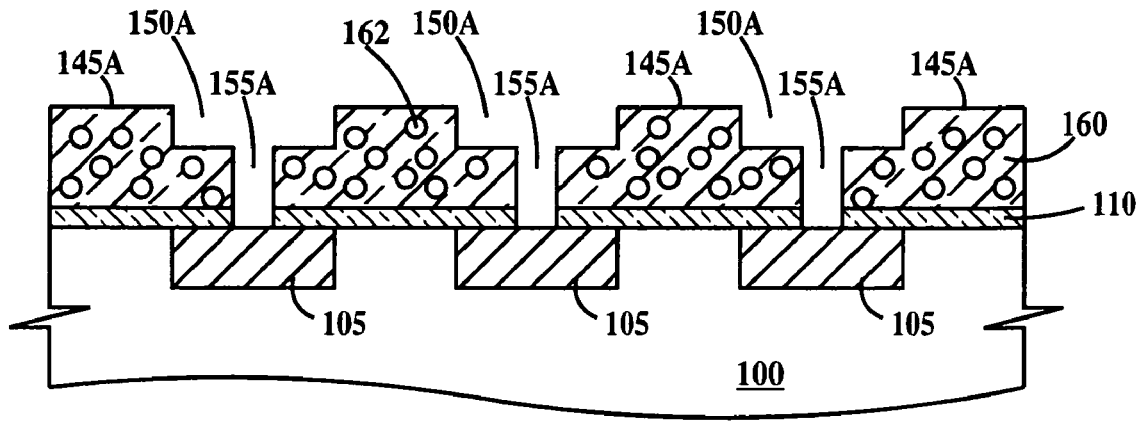
FIGS. 3A through 3C are cross sectional views of a method of fabricating a dual damascene wire according to the first embodiment of the present invention.
Figure 3B:
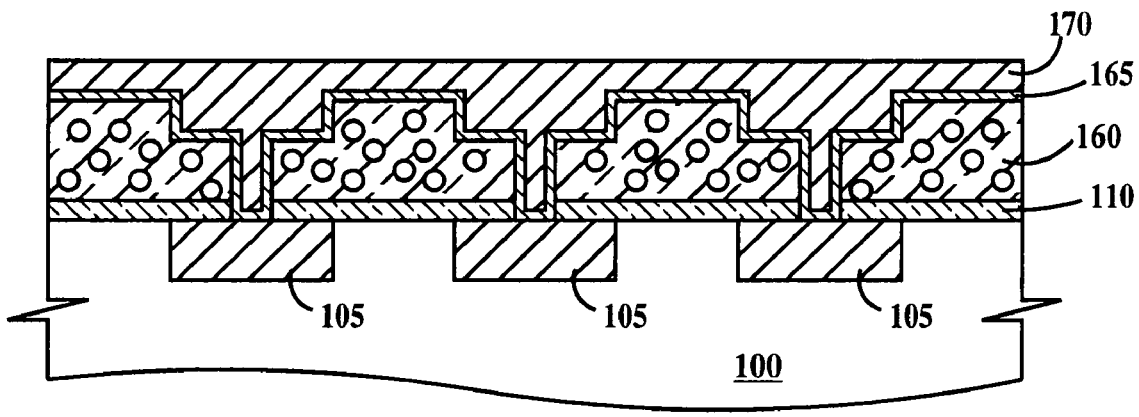
Figure 3C:
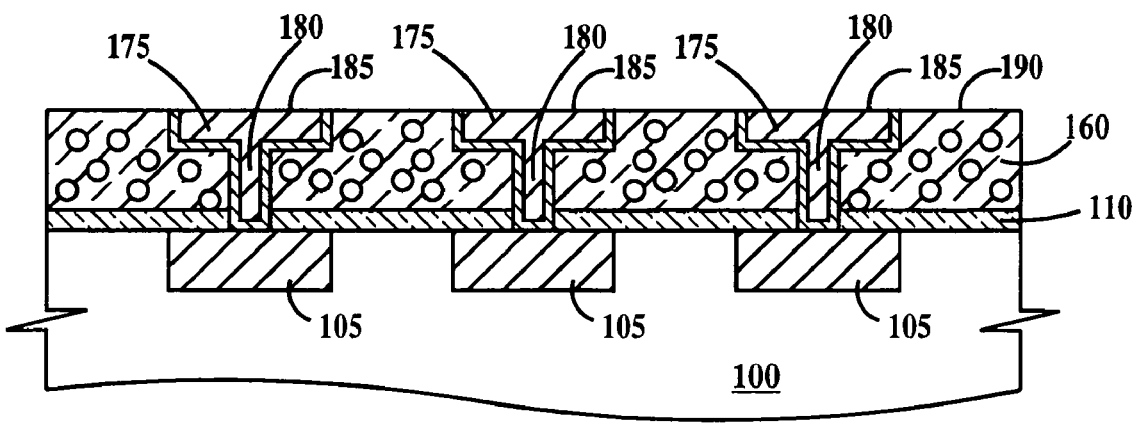

FIGS. 3A through 3C are cross sectional views of a method of fabricating a dual damascene wire according to the first embodiment of the present invention. In FIG. 3A, dielectric layer 140 (see FIG. 1F) is heated to a temperature high enough to fully cure the dielectric layer creating a porous dielectric layer 160 having pores 162. Applicants believe the high temperature cure performs three functions:

(1) the high temperature cure decomposes and volatize and drive out most if not all (if present) of the following carbonaceous materials: polymerized polymerizable monomers, non-polymerized polymerizable monomers, photoacid generators, photoacid generator reaction products, photoinitiators and photoinitiator reaction products thereby generating pores in the dielectric layer;

(2) the high temperature cure decomposes and volatilizes some or all of the substituent groups binding the PSS cages thereby generating pores in the dielectric layer; and;

(3) the high temperature cure forms siloxyl bonds between the PSS cages thereby creating a highly cross-linked resin.

In a first example, the cure is performed at a temperature of at least about 300° C. In a second example, the cure is performed at a temperature between about 300° C. and about 400° C. In a first example, porous dielectric layer 160 has a dielectric constant of less than that of silicon dioxide. In a second example, porous dielectric layer 160 has a dielectric constant of less than about 3.9. In a third example, porous dielectric layer 160 has a dielectric constant of less than about 3.1. In a fourth example, porous dielectric layer 160 has a dielectric constant of less than about 2.9.

In addition to or in place of the high temperature cures described supra, a non-thermal cure may be performed. Examples of non-thermal cures include but are not limited to exposure to ultra-violet radiation, microwave radiation and electron beams.

In FIG. 3B, a conformal electrically conductive layer 165 is formed on all exposed surfaces of porous dielectric layer 160 and wires 105 and an electrically conductive layer 170 of sufficient thickness to overfill trenches 150A (see FIG. 3A) is formed on top of conductive layer 165. In a first example, conductive layer 165 comprises tantalum, tantalum nitride, titanium, titanium nitride or combinations thereof. In a second example, conductive layer 165 comprises a seed layer of copper formed, for example, by deposition or evaporation. In a first example, conductive layer 170 comprises tungsten. In a second example, conductive layer 170 comprises copper formed, for example, by electroplating.

In FIG. 3C, a chemical-mechanical-polish (CMP) is performed to form damascene wires 175 having integral via 180, the vias in physical and electrical contact with wires 105. Top surfaces 185 of wires 175 are coplanar with a top surface 190 of porous dielectric layer 160.

Figure 4A:
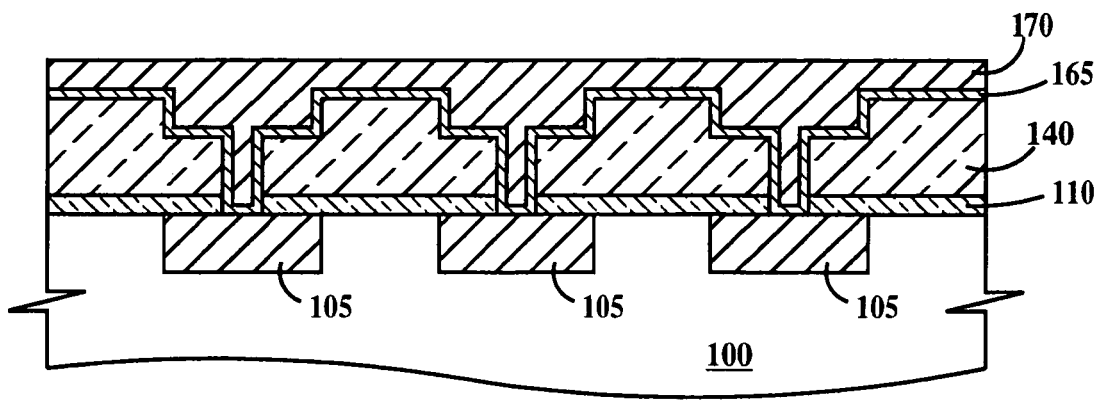
FIGS. 4A through 4C are cross sectional views of a method of fabricating a dual damascene wire according to the second embodiment of the present invention.
Figure 4B:
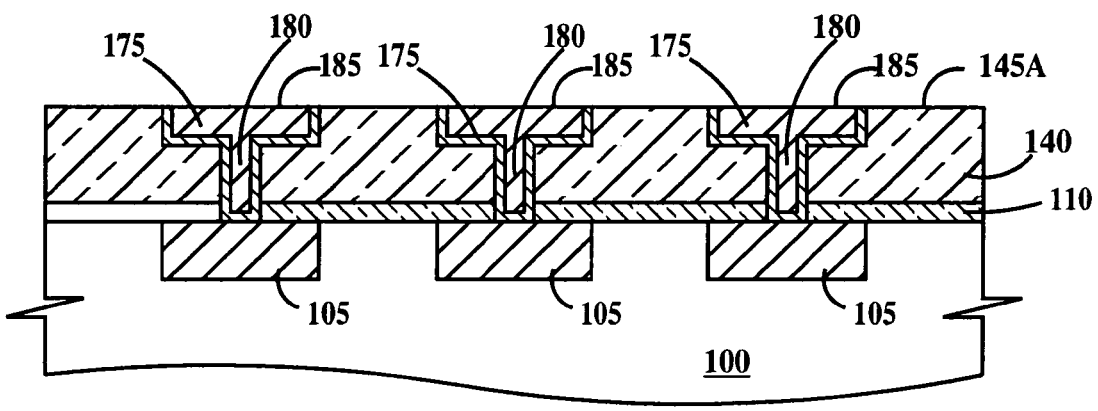
Figure 4C:
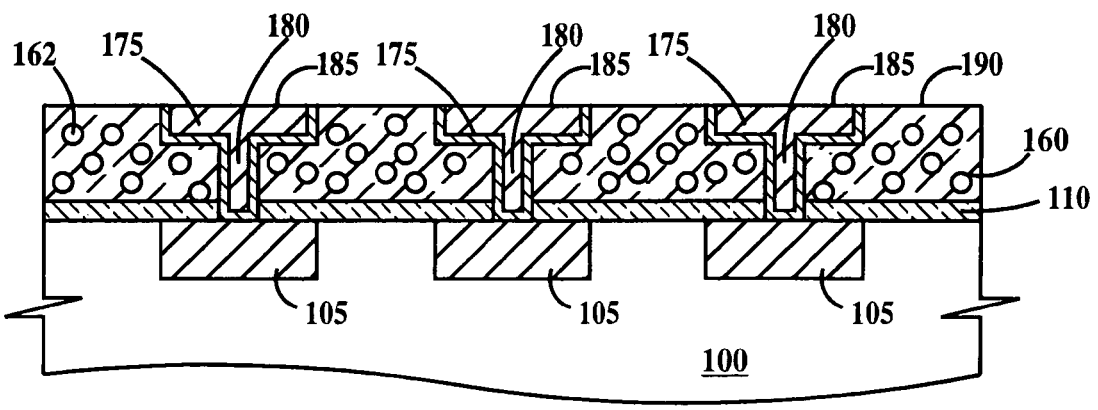

FIGS. 4A through 4C are cross sectional views of a method of fabricating a dual damascene wire according to the second embodiment of the present invention. In FIG. 4A, conformal electrically conductive layer 165 is formed on all exposed surfaces of dielectric layer 140 and wires 105. An electrically conductive layer 170 of sufficient thickness to overfill trenches 150A (see FIG. 3A) is formed on top of conductive layer 165. The compositions of conductive layers 165 and 170 have been described supra.

In FIG. 4B, a CMP is performed to form damascene wires 175 having integral vias 180, contact with wires 105 exposed in the bottoms of the vias. Top surfaces 185 of wires 175 are coplanar with a top surface 145A of dielectric layer 140.

In FIG. 4C, dielectric layer 140 (see FIG. 4B) is heated to a temperature high enough to fully cure the dielectric layer creating, a porous dielectric layer 160 having pores 162. The curing process has been described supra.

In a first example, the cure is performed at a temperature of at least 300° C. In a second example, the cure is performed at a temperature between about 300° C. and about 400° C. The properties of porous dielectric layer 160 have been described supra.

The imprintable precursor dielectric materials of the present invention include one or more substituted PSS oligomers and a photoinitiator and/or a photo-acid generator. The precursor dielectric materials may further include a low viscosity polymerizable monomer and/or a solvent. One purpose for including a low viscosity polymerizable monomer and/or a solvent is to reduce the viscosity of imprintable precursor dielectric materials. Another purpose for including a low viscosity polymerizable monomer and/or a solvent is to provide additional porogen.

The substituted PSS oligomers of the present invention, in one example, are resins having the structures (I), (II), (III) or (IV) where:

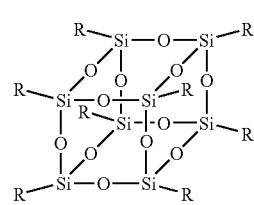

is denoted by the formula $T_8^R$, where T represents $R\,SiO_{3/2}$;

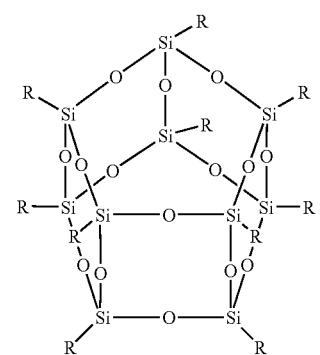

is denoted by the formula $T_{10}^R$, where T represents $RSiO_{3/2}$;

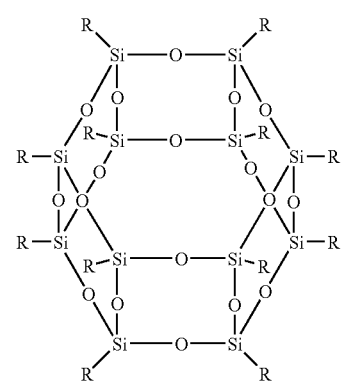

is denoted by the formula $T_{12}^R$, where T represents $R\,SiO_{3/2}$; and

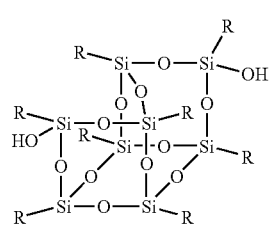

wherein one or more R groups are independently selected from the group of polymerizable groups consisting of:

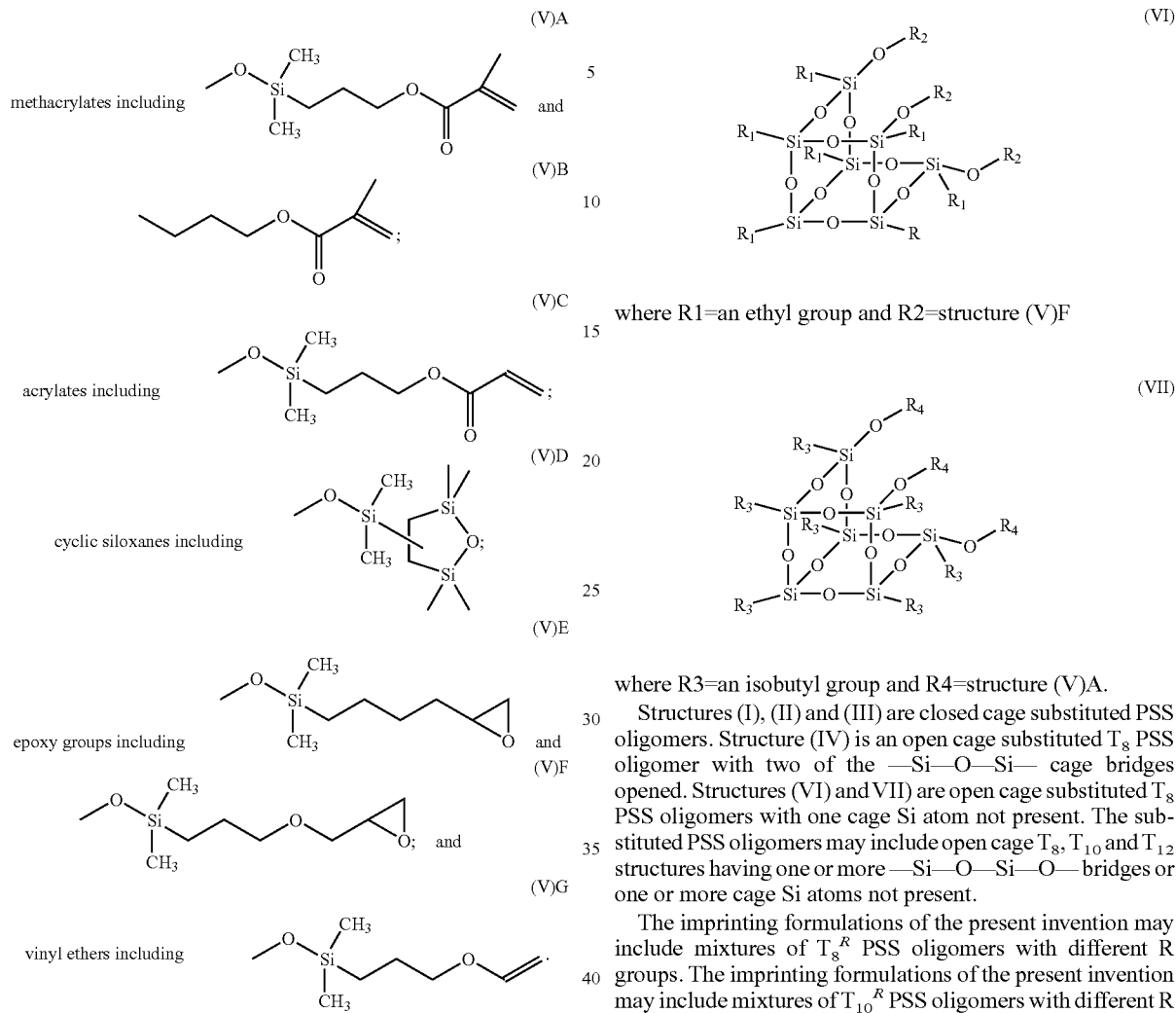

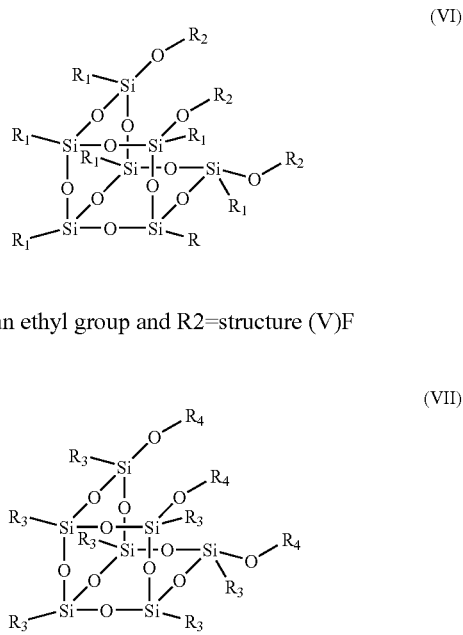

where R1=an ethyl group and R2=structure (V)F where R3=an isobutyl group and R4=structure (V)A.

Structures (I), (II) and (III) are closed cage substituted PSS oligomers. Structure (IV) is an open cage substituted $T_8$ PSS oligomer with two of the —Si—O—Si— cage bridges opened. Structures (VI) and (VII) are open cage substituted $T_8$ PSS oligomers with one cage Si atom not present. The substituted PSS oligomers may include open cage $T_8$, $T_{10}$ and $T_{12}$ structures having one or more —Si—O—Si—O— bridges or one or more cage Si atoms not present.

The imprinting formulations of the present invention may include mixtures of $T_8^R$ PSS oligomers with different R groups. The imprinting formulations of the present invention may include mixtures of $T_{10}^R$ PSS oligomers with different R groups. The imprinting formulations of the present invention may include mixtures of $T_{12}^R$ PSS oligomers with different R groups. The imprinting formulations of the present invention may include mixtures of open and closed cage $T_8^R$, $T_{10}^R$ and $T_{12}^R$ PSS oligomers. The R groups need not be the same on different PSS oligomers of the imprinting formulations.

Suitable photoinitiators include but are not limited to: acetophenone, anisoin, anthraquinone, anthraquinone-2-sulfonic acid, (benzene)tricarbonylchromium, benzil, benzoin, benzoin ethyl ether, benzoin isobutyl ether, benzoin methyl ether, benzophenone, 3,3',4,4'-benzophenonetetracarboxylicdianhydride, 4-benzoylbiphenyl, 2-benzyl-2-(dimethylamino)-4'-morpholinobutyrophenone, 4,4'-bis(diethylamino)benzophenone, 4,4'-bis(dimethylamino)benzophenone, camphorquinone, 2-chlorothioxanthen-9-one, (cumene)cyclopentadienyliron(II)hexafluorophosphate, dibenzosuberenone, 2,2-diethoxyacetophenone, 4,4'-dihydroxybenzophenone, 2,2-dimethoxy-2-phenylacetophenone, 4-(dimethylamino)benzophenone, 4,4'-dimethylbenzil, 2,5-dimethylbenzophenone, 3,4-dimethylbenzophenone, diphenylbis(2,4,6-trimethylbenzoyl)phosphine oxide, 4'-ethoxyacetophenone, 2-ethylanthraquinone, ferrocene, 3'-hydroxyacetophenone, 4'-hydroxyacetophenone, 3-hydroxybenzophenone, 4-hydroxybenzophenone, 1-hydroxycyclohexy phenyl ketone, 2-hydroxy-2-methylpropiophenone, 2-methylbenzophenone, 3-methylbenzophenone, Alternatively, the polymerizable R groups may comprises the structure—$(L)_n$—P, where L is a linking group, n is 0 or 1 and P is a polymerizable moiety, wherein each linking group is independently selected from the group consisting of alkyl groups, cycloalkyl groups, siloxanes, alkylsilyl groups, and alkyl-siloxyl groups.

The substituted PSS oligomers of the present invention may be denoted by the general formulas $T_m^R$ where m is equal to 8, 10 or 12. When m=8 a common name of the compound is octakis(N) silsesquioxane, where N is the name of the indicated R group.

Structure (IV) may be considered exemplary of an open cage substituted PSS oligomer of a first type where each silicon atom of the cage is bound to the proper number of oxygen atoms (three in structure IV), while some of the oxygen atoms are not bound to two silicon atoms (the two —OH groups in structure IV).

Structures (VI) and (VII) illustrated infra, are examples of a second type of open cage PSS structure where one or more silicon atoms of the cage are not present, but every silicon atom of the cage is still bound to the proper number of oxygen atoms.

methylbenzoylformate, 2-methyl-4'-(methylthio)-2-morpholinopropiophenone, phenanthrenequinone, and 4',phenoxyacetophenone, thioxanthen-9-one.

Suitable photo-acid generators include, but are not limited to: sulfonium salt, triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium, diphenylethylsulfonium chloride, phenacyldimethylsulfonium chloride, halonium salts, diphenyliodonium perfluoromethanesulfonate (diphenyliodonium triflate), diphenyliodonium perfluorobutanesulfonate, diphenyliodonium perfluoropentanesulfonate, diphenyliodonium, diphenyliodonium hexafluoroantimonate, diphenyliodonium hexafluoroarsenate, bis-(t-butylphenyl)iodonium triflate, bis-(t-butylphenyl)-iodonium camphorsulfonate, α,α'-bis-sulfonyl-diazomethanes, bis(p-toluenesulfonyl)diazomethane, methylsulfonyl p-toluenesulfonyldiazomethane, 1-cyclohexylsulfonyl-1-(1,1-dimethylethylsulfonyl)diazomethane, bis(cyclohexylsulfonyl)diazomethane, trifluoromethanesulfonate esters of imides and hydroxyimides, (trifluoromethylsulfonyloxy)-bicyclo[2.2.1]hept-5-ene-2,3-dicarboximide (MDT), nitrobenzyl sulfonate esters, 2-nitrobenzyl p-toluenesulfonate, 2,6-dinitrobenzyl p-toluenesulfonate, 2,4-dinitrobenzyl p-trifluoromethylbenzenesulfonate; sulfonyloxynaphthalimides, N-camphorsulfonyloxynaphthalimide and N-pentafluorophenylsulfonyloxynaphthalimide; pyrogallol derivatives (e.g., trimesylate of pyrogallol), naphthoquinone-4-diazides, alkyl disulfones, s-triazine derivatives; sulfonic acid generators, t-butylphenyl-α-toluenesulfonyloxy)-acetate, t-butyl-α-(p-toluenesulfonyloxy)acetate, N-hydroxy-naphthalimide dodecane sulfonate (DDSN), and benzoin tosylate and materials represented by the following structures:

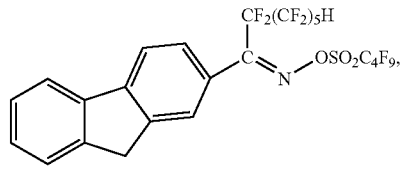

(VIII)

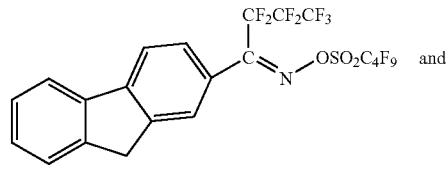

(IX)

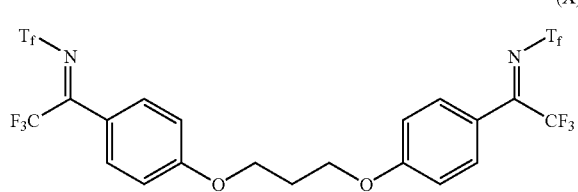

(X)

where $T_f = CF_3S(O)_2O-$.

Suitable low viscosity polymerizable monomer diluents include but are not limited to: mono- or di-functional methacrylates, including isobornyl methacrylate, glycidyl methacrylate, n-butyl methacrylate, methyl methacrylate and ethylene glycol dimethacrylate; methacrylate esters; mono- or di-functional acrylates including isobornyl acrylate, octyl acrylate, ethylene glycol diacrylate; vinyl ethers including butyl vinyl ether, ethylene glycol divinyl ether; and glycidyl ethers including ethylene glycol diglycidyl ether.

EXAMPLES

The silsesquioxane starting material, octakis(dimethylsilyloxy)silsesquioxane, was purchased from Hybrid Plastics. PSS derivative, (Methacryloxypropyl)silsesquioxane cage mixture (8, 10 and 12 atom silicon cages) was also obtained from Hybrid Plastics. The photoinitiators were purchased from CIBA or Aldrich Chemical Company. All the other chemicals were purchased from Aldrich Chemical Company. The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of errors and deviations.

Where appropriate, the following techniques and equipment were utilized in the Examples: $^1H$, $^{13}C$ and $^{29}Si$ NMR spectra were obtained at room temperature on an Avance 400 spectrometer. The viscosities of the imprinting formulations were determined using a Paar Physica MCR Rotating Disc Rheometer. The imprints of the imprinting formulations were fabricated using a Molecular Imprints Imprio 55 (MII55) imprint tool. The imprint force applied was set to approximately 3 newtons. The exposure dose of 365 nm radiation was approximately 300 mJ/cm$^2$. Films thicknesses and refractive indices were measured using a Filmetrics F20 Thin-Film Measurement System. Dielectric constants were determined using a capacitance bridge with an HP 4192A impedance analyzer using a metal insulator semi-conductor structure. Measurements were done at 25° C. and 100 KHz. Young's modulus measurements were obtained using a Fraunhofer LA Wave surface acoustic wave spectrometer (SAWS) operating between 50 MHz-200 MHz and sampling each specimen at five different spots. Densities were determined by specular x-ray reflectivity.

Synthesis Example 1

Synthesis of Octakis(methacryloxypropyl dimethylsilyloxy)silsesquioxane

Octakis(dimethylsilyloxy)silsesquioxane (10.2 grams, 0.01 mole), allyl methacrylate (10.10 g, 0.08 mole), and tetrahydrofuran (THF) (100 ml) were placed in a round bottom flask equipped with a magnetic stirrer, nitrogen inlet, and a water condenser. The flask was cooled in an ice/water bath and platinum(0)-1,3-divinyl-1,1,3,3-tetramethyldisiloxane complex in xylene (1 ml) was added to this mixture and stirred for one hour. The mixture was then allowed to warm to room temperature and stirred for 4 hours at which time the reaction was complete as determined by the IR spectrum of the mixture. The solvent was removed in a rotary evaporator and the residue was dried under vacuum at room temperature to give a viscous liquid (20 g). The spectral data indicates that there are two isomers in the product. The substituent groups were structure (V)A.

Imprinting Composition Example 1

Imprinting composition 1 is based on Octakis(methacryloxypropyl dimethylsilyloxy)silsesquioxane. The polymerizable substituent groups are structure (V)A.

Imprinting composition 1 was formulated with octakis (methacryloxypropyl dimethylsilyloxy)silsesquioxane (1 g), DAROCUR 4265 (60 mg) and propylene glycol methyl ether acetate (PGMEA) (1.35 g). (DAROCUR 4265 is a mixture of 50% 2,4,6-trimethylbenzoyl-diphenyl-phosphineoxide and 50% 2-hydroxy-2-methyl-1-phenyl-propan-1-one.) The resulting imprinting composition was filtered through a 0.2 micron filter. This imprinting composition was then spin coated on two 3 inch silicon wafers and both the films were exposed to 254 nm UV radiation for 5 minutes to polymerize the films. Afterwards, one of the two wafers was cured at 400° C. for 1 hour under $N_2$ atmosphere. TABLE I summarizes some properties of the thermally cured and uncured films. The thermally cured film has a dielectric constant of 2.89.

TABLE I

| FILM | Thickness (nm) | Refractive Index | Water Contact Angle | Density (gram/cm$^3$) | Dielectric Constant | E Modulus (GPa) |
|---|---|---|---|---|---|---|
| NOT CURED | 866 | 1.4825 | 90° | 1.24 | 3.98 | 7.03 +− 0.13 |
| CURED 400° C. | 559 | 1.4082 | 92° | 1.17 | 2.89 | 3.55 +− 0.07 |

Imprinting Composition Example 2

Imprinting composition 2 is based on a (Methacryloxypropyl)silsesquioxane mixture. The polymerizable substituent groups are structure (V)B the PSS base structures were closed cage $T_8$, $T_{10}$ and $T_{12}$.

Imprinting composition 2 was formulated with the (Methacryloxypropyl)silsesquioxane cage mixture (1.0 gram), IRGACURE 184 (1-hydroxycyclohexyl phenyl ketone) (30 mg), IRGACURE 819 (diphenyl(2,4,6-trimethylbenzoyl) phosphine oxide) and propylene glycol methyl ether acetate (PGMEA) (structure 3F) (2.0 g) were added. The resulting imprinting composition was filtered through a 0.2 micron filter. The imprinting composition was then spin coated on two 3 inch silicon wafers and both the films were exposed to 365 nm radiation for 15 minutes to polymerize the films. Afterwards, one of the two wafers was cured at 400° C. for 1 hour under $N_2$ atmosphere. TABLE II summarizes some properties of the thermally cured and uncured films. The thermally cured film has a dielectric constant of 3.05.

Imprinting Composition Example 3

Figure 5:
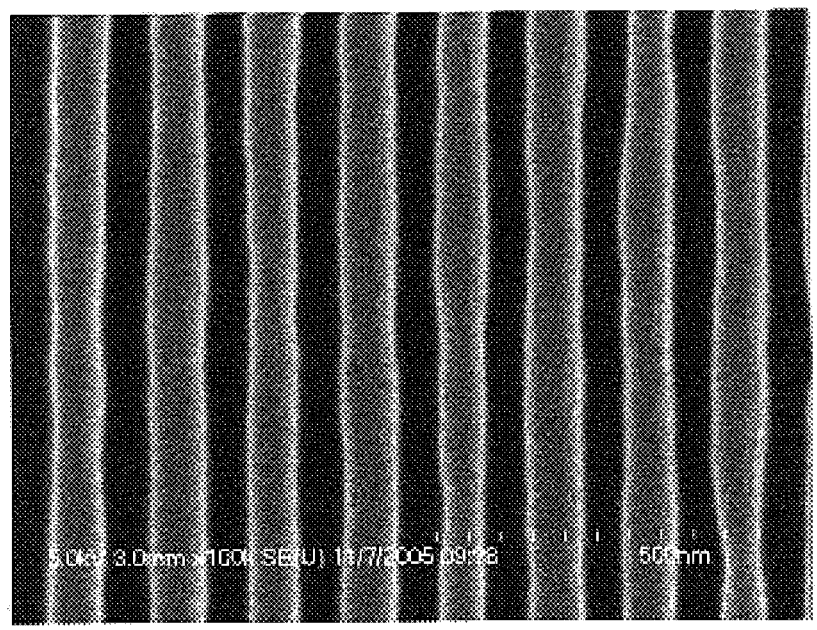
FIGS. 5 and 6 are SEM photomicrographs of imprinted structures formed from imprinting compositions according to embodiments of the present invention.

Imprinting composition 3 is based on Octakis(methacryloxypropyl dimethylsilyloxy)silsesquioxane. The polymerizable substituent groups are structure (V)A and the polymerizable diluent isobornyl methacrylate. Imprinting composition was formulated with octakis(methacryloxypropyl dimethylsilyloxy)silsesquioxane (2.0 g), isobornyl methacrylate (4.0 g), and IRGACURE 184 (150 mg) and IRGACURE 819 (150 mg). The resulting formulation was filtered through a 0.2 micron filter. The viscosity of the formulation is 25 cPs at 20° C. Imprints of this formulation were obtained using a MII55 imprint tool. A top down SEM of nominal 50 nm line/space features obtained are illustrated in FIG. 5.

Imprinting Composition Example 4

Imprinting composition 4 is based on a (Methacryloxypropyl)silsesquioxane mixture. The polymerizable substituent groups are structure (V)B the PSS base structures were closed cage $T_8$, $T_{10}$ and $T_{12}$ and the polymerizable diluent is isobornyl methacrylate.

Figure 6:
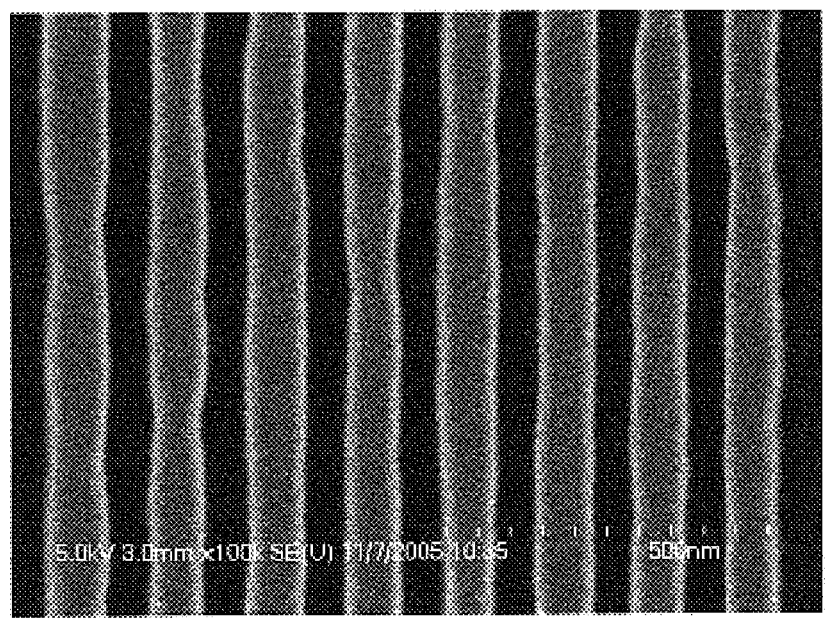

Imprintable composition 4 was formulated with the Methacryloxypropyl silsesquioxane cage mixture (1 g), isobornyl methacrylate (1 g), and IRGACURE 184 (60 mg) and IRGACURE 819 (60 mg). The resulting formulation was filtered through a 0.2 micron filter. The viscosity of this formulation is 80 centipoise at 20° C. The imprints of this formulation were obtained using a MII55 imprint tool. A top down SEM of nominal 50 nm line/space features obtained are illustrated in FIG. 6.

Thus, the embodiments of the present invention provide semiconductor interconnection structures and processes that are dense and have low capacitance.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

TABLE II

| FILM | Thickness (nm) | Refractive Index | Water Contact Angle | Density (gram/cm$^3$) | Dielectric Constant | E Modulus (GPa) |
|---|---|---|---|---|---|---|
| NOT CURED | 1075 | 1.49015 | 75° | 1.348 | 4.36 | 6.29 +− 0.12 |
| CURED 400° C. | 664 | 1.4811 | 72° | 1.268 | 3.05 | 5.97 +− 0.10 |

What is claimed is:

1. A method of forming a structure, comprising:

forming on a substrate a precursor dielectric layer of a polymerizable composition comprising one or more polyhedral silsesquioxane oligomers each having one or more polymerizable groups, one or more polymerizable diluents, and (i) one or more photoacid generators, (ii) one or more photoinitiators, or (iii) a mixture of one or more photoacid generators and said one or more photoinitiators;

pressing a surface of a template into said precursor dielectric layer, said template having a relief pattern on said surface, said precursor dielectric layer filling voids in said relief pattern;

polymerizing said precursor dielectric layer and converting said precursor dielectric layer to a dielectric layer having thick and thin regions corresponding to said relief pattern;

removing said template;

removing said thin regions of said dielectric layer;

either (i) curing said dielectric layer to create a porous dielectric layer followed by filling spaces between said thick regions of said porous dielectric layer with an electrically conductive material or (ii) filling spaces between said thick regions of said dielectric layer with an electrically conductive material followed by curing said dielectric layer to create a porous dielectric layer;

wherein said polymerizing said precursor dielectric layer includes exposing said precursor dielectric layer to ultra-violet radiation;

wherein said curing is performed at a temperature above about 300° C.;

wherein said porous dielectric layer has a dielectric constant less than 3.9; and wherein said filling spaces between said thick regions of said dielectric layer includes either (a) depositing a conformal layer of copper over said dielectric layer, followed by electroplating a plated layer of copper on top of said conformal layer of copper, followed by removing portions of said conformal and plated layers of copper so top surfaces of said conformal and plated layers of copper are coplanar with a top surface of said dielectric layer, or (b) depositing a conformal layer of copper over said porous dielectric layer, followed by electroplating a plated layer of copper on top of said conformal layer of copper, followed by removing portions of said conformal and plated layers of copper so top surfaces of said conformal and plated layers of copper are coplanar with a top surface of said dielectric layer.

* * * * *